July 5, 1966 D. J. GARIBOTTI 3,258,898

ELECTRONIC SUBASSEMBLY

Filed May 20, 1963

INVENTOR
DOMENICK J. GARIBOTTI
BY [signature]
ATTORNEY

United States Patent Office 3,258,898
Patented July 5, 1966

3,258,898
ELECTRONIC SUBASSEMBLY

Domenick J. Garibotti, Longmeadow, Mass., assignor to United Aircraft Corporation, East Hartford, Conn., a corporation of Delaware Filed May 20, 1963, Ser. No. 281,419
4 Claims. (Cl. 29—155.5)

This invention is directed to an electronic subassembly. More particularly, this invention relates to microminiaturized electronic circuitry employing thin film passive components, microsized components and active devices, and functional electronic blocks.

One continuous and consistent trend in the history of electronics has been the reduction in the size and weight of the assembly needed for any particular electronic function. The term generally applied to this trend is microminiaturization. In recent years, much progress has been made in the microminiaturization of discrete electronic components as well as the integration of devices into so-called functional or logic blocks, now commonly referred to as monolithic circuits. However, these size reductions have brought about severe problems in interconnecting the individual elements and the functional blocks. Quite often the volumetric efficiency of the electronic subassembly is limited by this interconnection problem. Also, as the number of such connections increases, circuit reliability must necessarily decrease. A further limitation is placed on volumetric efficiency by the fact that, due to their susceptibility to contamination in junction regions, the semiconductor devices used in microcircuitry must be hermetically encapsulated. The size of the encapsulating member and associated heat sink are generally many times that of the semiconductor device itself.

It is therefore an object of this invention to overcome the above stated problems and provide microminiaturized electronic subassemblies having high volumetric efficiency.

It is another object of this invention to provide a novel electronic subassembly which may utilize uncased semiconductor devices.

It is also an object of this invention to provide a novel electronic subassembly having high component packaging density which may utilize thin film passive components, independent active microcomponents, and functional electronic blocks.

It is a further object of this invention to provide an improved microcircuit utilizing thin film techniques which eliminates costly masking steps during fabrication.

It is yet another object of this invention to provide a microcircuit assembly which may be fabricated quickly and inexpensively.

These and other objects of this invention are accomplished by providing terminal pads and interconnecting conductive or resistive paths on one or both surfaces of a substrate wafer, here-in-after referred to as a microcircuit wafer. The interconnecting paths between selected terminal pads may form both conductors and thin film passive circuit components. Unencapsulated active devices, functional electronic blocks or other discrete electronic devices are affixed to at least some of the terminal pads and electrical connection of these devices and functional blocks to other pads and each other is provided by conductors which underlay or overlay a film of insulating material grown or deposited over the thin film circuitry.

This invention may be better understood and its numerous advantages will become apparent to those skilled in the art by reference to the accompanying drawing wherein like reference numerals refer to like elements in the various figures and in which.

Figures 1, 2, 3, 4, 5, 6, 7:
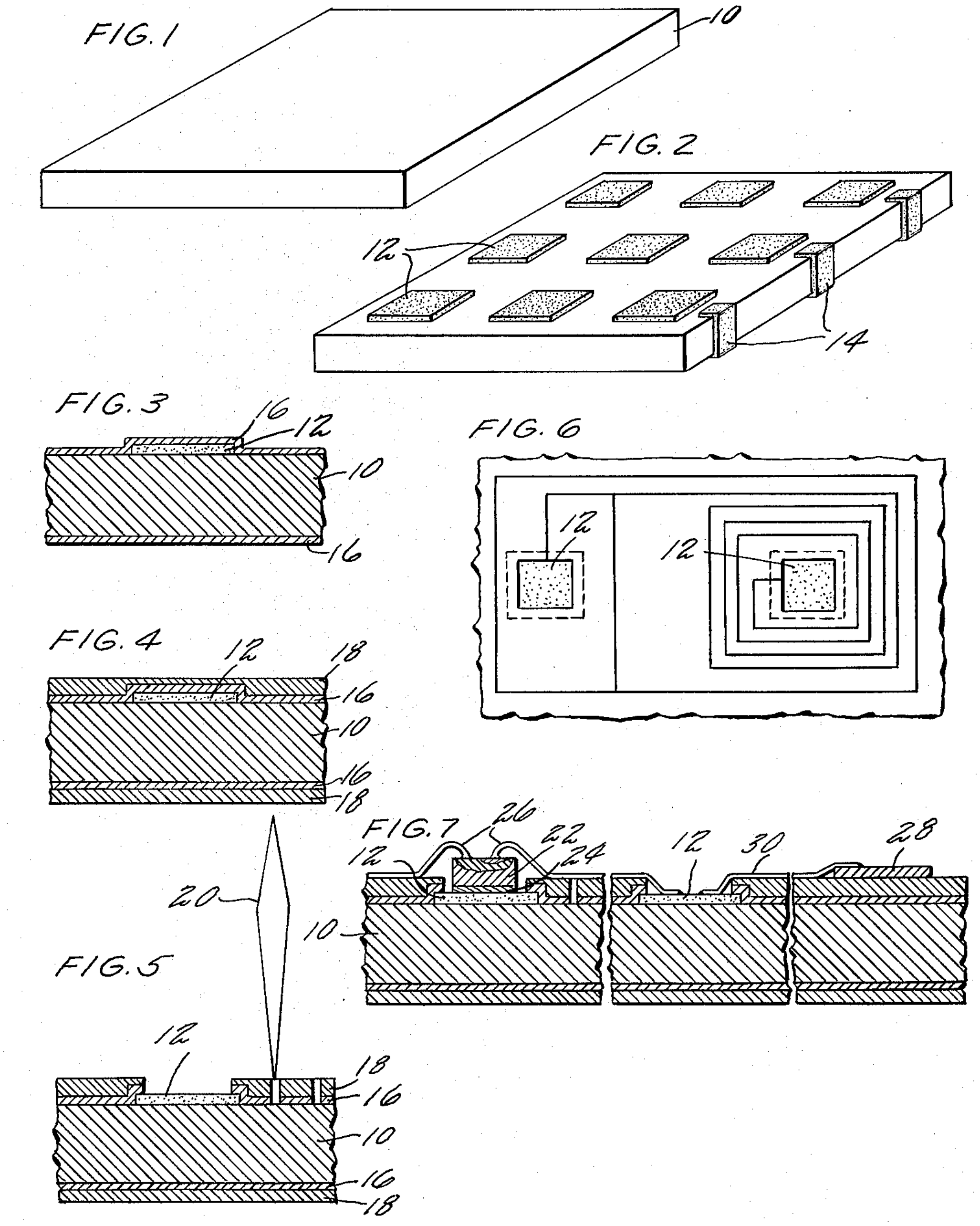
FIGURE 1 depicts a substrate board which is to be used as the microcircuit wafer for the subassembly that comprises this invention.
FIGURES 2 through 7 illustrate the various steps in the fabrication of the microminiaturized electronic subassembly of this invention.

Referring now to FIGURE 1, there is shown a microcircuit wafer 10 which will be of the type preferably used in microminiaturized electronic subassemblies produced in accordance with this invention. While materials such as glasses could be employed, it is desirable to use ceramic materials for the wafers since these materials are insulators, they are relatively strong and lightweight and because they have superior heat transfer characteristics and higher service temperature limits than other substrate materials such as the well-known polymeric boards. Two ceramics, beryllia (BeO) and alumina ($Al_2O_3$), have been found to be particularly desirable for use as microcircuit wafers in accordance with this invention. Because of its inherent high thermal conductivity, beryllia is best suited for applications where high thermal loads are anticipated such as in servo amplifiers. Alumina is of interest where extreme thermal loads are not expected since it is easier to handle from a fabrication standpoint.

The first step in the fabrication of a microminiaturized electronic subassembly in accordance with this invention is depicted in FIGURE 2. In this figure a plurality of discrete terminal pads 12 are shown formed on the upper surface of wafer 10. Also formed around the periphery of wafer 10 are a plurality of circuit termination pads 14 which may be used for the connection of the circuit carried by wafer 10 into an electronic device. These metal pads may be applied to the ceramic wafer by such techniques as the moly-manganese process, the titanium hydride technique, or the active alloy (Ti or Zr) technique. Essentially, all of these processes afford a means to apply a tenaciously adherent metal coating to a substrate. In accordance with the prefered embodiment of this invention, the pads 12 and 14 are moly-manganese which has been applied to the surface of the wafer 10 by a silk screen process. While, as indicated above, there are many methods by which the pads 12 and 14 may be applied to the surface of the microcircuit wafer, such as vapor deposition or spraying through a mask, the silk screen processes have been found to be the most accurate and eonomical means of applying the terminal pads since it eliminates the use of expensive masks. After application and subsequent firing of the moly-manganese or other metal, the pads themselves may be coated with a thin layer of nickel by either electroplating or by an electroless nickel coating procsess. Since the nickel will only adhere to the areas where there is a metallic coating on the ceramic, only the terminal pads will be coated therwith. The purpose of the coating of nickel, when employed, is to promote the joining of components and devices to the pads, to lower the resistivity of the pads, and to afford a layer of high thermal conductivity material for the dissipation of thermal energy from hot spots such as occur in the junction areas of semi-conductor devices. Since this thin layer of nickel may be dispensed with it is not shown in the drawing. It should be noted that other metals and brazing compounds may be used rather than nickel. In a typical example pads 12 will be formed on a .050 inch grid. The formation of isolated metalized pads on a grid throughout the wafer surface makes the microcircuits produced in accordance with this invention particularly compatible with area thin film deposition techniques. The foregoing would not be true if masks were used since the latter require support. Location of the pads on a grid pattern is desirable since it provides standardization. Furthermore, location of the pads throughout the surface of the microcircuit wafer enhances surface utilization by cutting down the length of the conductive paths between the circuit components. Also, as will be shown in more detail below, when unencapsulated active devices are brazed or otherwise attached to the pads, elimination of one lead or interconnection is achieved with a consequent improvement in reliability. In the usual case the pads will be formed on both sides of the microcircuit wafer. Communication between the circuitry on the two surfaces is possible by utilizing thin film conductive paths wrapped around the edges of the wafer or by fabrication of vertical conductive paths through the wafer prior to the deposition of the terminal pads. The vertical feedthroughs, if desired, may be fabricated by any of the several methods disclosed in copending application Serial No. 186,467, filed April 10, 1962, by myself and L. R. Ullery, Jr. as co-inventors, now U.S. Patent No. 3,178,804, issued April 20, 1965.

After fabrication of the metallic pads, the step resulting in the structure depicted in cross-section in FIGURE 3 is performed. This step consists of the vacuum depositing, sputtering, or gas plating of a thin film of chromium or other suitable conductive material such as Nichrome, tantalum, platinum, rhenium, etc., over the surface of wafer 10 and pads 12. As employed herein, the term conductive material includes metals, compounds, alloys, etc. having a resistivity which will enable it to function, when properly formed into a pattern, the function of a resistor, conductor or both. One of the distinct advantages realized through use of this invention is that the thin films, which form the pads and layer of conductive material, may be sequentially deposited without masking the wafer. The necessity of costly masks and their support means is thus eliminated. There is a requirement that the peripheral terminations 14 be masked during application of the metallic coating, but this is simply accomplished by the wafer holder utilized during the coating process. In FIGURE 3, which depicts a sectional view of a portion of wafer 10 having a single pad 12 on the surface thereof, the film of conductive material is indicated by reference numeral 16. Typically, the film of conductive material will be in the neighborhood of 150 angstroms thick and will have a resistivity of approximately 100 ohms per square. Since the deposited thin film will be operated on to define thin film passive components or conductive paths, it is possible to deposit layers providing lower ohms per square than 100 and still obtain either or both relatively high value resistors and conductors.

Referring now to FIGURE 4, the next step in the fabrication of the microcircuit which comprises this invention consists of the step of depositing or growing a film of insulating material, such as a silicon oxide ($SiO_x$), over the previously deposited film of conductive material. The functions of this film of insulating material, indicated in FIGURE 4 by reference numeral 18, are to provide both insulation and protection for film 16. Thus layer 18 protects film 16 from the environment during assembly prior to final hermetic sealing and may be used as the dielectric material for thin film capacitors. It is to be noted that, when a refractory material such as tantalum is employed as film 16, insulating film 18 may be formed by anodizing the surface of film 16 rather than by being deposited through evaporation of a charge of the appropriate material. For further disclosure on this point, reference may be had to U.S. Patent No. 2,993,266, issued July 25, 1961, to R. W. Berry.

At this stage in the fabrication process, all of terminal pads 12 are short-circuited by film 16. Thus it is necessary to form discrete conductive paths between desired ones of the terminal pads by selectively removing portions of the layer of chromium. While chemical etching may be employed, in accordance with one embodiment of this invention, these discrete conductive paths and also thin film passive circuit components are formed by selectively etching away portions of films 16 and 18 by causing local evaporation thereof with a highly energized beam which may be deflected across the surface of the microcircuit wafer 10 in accordance with a predetermined pattern. While this might be done with a device such as a laser, an intense beam of electrons has been found to be a particularly efficient tool for such purposes. A device capable of providing the necessarily intense electron beam is disclosed in U.S. Patent No. 2,987,610, issued June 6, 1961, to K. H. Steigerwald. The electron beam is a welding or machining tool which has practically no mass but has high kinetic energy because of the extremely high velocity imparted to the electrons. Transfer of this kinetic energy to the lattice electrons of the workpiece generates higher lattice vibrations which cause an increase in the temperature within the impingement area sufficient to accomplish work. Present state of the art electron beam machines of the type shown in the Steigerwald patent, as a result of recently developed refinements in electron optics, can provide a beam focussed to produce power densities on the order of 10 billion watts per square inch. Such beams may be focussed so as to have diameters of less than .0005 inch at the point of impingement on the work. Impingement of such a highly focussed, intense electron beam on the surface of the wafer will etch away portions of the insulating and underlying conductive films by causing local evaporation thereof. By programming the beam deflection by means well known in the art, this process quickly, accurately and automatically forms discrete conductive paths separated by areas in which the conductive material has been selectively removed. These areas thus become insulating regions. Through proper selection of the beam power density; which is a function of the electron accelerating voltage, the number of electrons in the beam, and the beam diameter or spot size; and the speed at which the beam is deflected across the surface of the coated microcircuit wafer, vaporization of films 16 and 18 may be caused without damage to the ceramic substrate. That is, the beam power density and deflection rate will control the depth of penetration of the electrons so that they will penetrate only through films 16 and 18. The thermal energy released during a properly programmed electron beam etching process will, in the worst case, cause only light fusing of the surface of the ceramic wafer. As explained in copending application No. 220,987, filed Sept. 4, 1962 by R. A. Di Curcio et al., now U.S. Patent No. 3,162,767, issued Dec. 22, 1964, and assigned to the same assignee as the present invention, the condition of the ceramic after the etching step may be used in a non-destructive testing step, which also utilizes the electron beam, to provide an indication of whether the resulting thin film circuitry has flaws or regions where all the conductive material has not been removed. Use of electron beam scribing determines the choice of terminal pad material. The electron beam etching characteristics of different materials vary considerably. Moly-manganese, indicated above as a desirable pad material, is extremely resistant to being evaporated from a substrate by electron beam etching. Thus, the beam may be used to remove the layers of Cr and $SiO_x$ over the pads without damaging the pads. In FIGURE 5, an electron beam depicted by reference numeral 20 has removed films 18 and 16 from the pad areas. As can be seen from FIGURE 5, the area of pad 12 exposed by the electron beam etching is smaller than the original area of the pad, but is sufficiently large to make contact with independent circuit components or leads. After etching to expose the pad areas the beam is used to etch discrete conductive paths between pads. These conductive paths may be merely conductors or may be thin film passive components. In FIGURE 6, which is a top view of a portion of wafer 10 which has been scribed with an electron beam, the lines on the surface of the wafer indicate areas where the conductive material has been removed thereby providing insulating regions. In FIGURE 6 a very long conductive path has been scribed between the two terminal pads. As is well known in the art, such a long conductive path, due to the resistivity of the film of conductive material, becomes a thin film resistor. Consequently, the two terminal pads shown in FIGURE 6 are connected through a resistor, the resistivity of which may be determined by controlling the length of the conductive path between the two pads.

After formation of the thin film circuitry, the individual circuit components are attached to the terminal pads. In FIGURE 7, an active silicon chip 22 is bonded to a terminal pad 12 by the so-called eutectic technique employing a gold-silicon or gold preform 24 of the same size as the chip which is placed between the metalized pad 12 and the chip 22. The structure is heated either locally or throughout to approximately 400 to 450° C. at which temperature bonding occurs since silicon and gold form a eutectic which melts at 370° C. At this point, it should be noted that there is considerable flexibility in the process of fabricating the subassembly which comprises this invention. Thus, when the eutectic technique is employed for bonding the active chips to the pads the layer of nickel mentioned above may be omitted or, when nickel coating is employed, the chips may be brazed to the nickel with the use of metals or alloys having a lower melting point than a eutectic. In the case where active chip 22 is an unencapsulated planar transistor or other monolithic silicon active circuit device, bonding of the chip to the terminal pad by the above-described eutectic technique provides connection between the collector electrode of the transistor and the thin film circuitry and thereby eliminates the previously needed collector interconnection path or lead. In the usual case, the chips will have vacuum deposited base and emitter terminal pads on the tops thereof. As shown in FIGURE 7, gold or aluminum wire or ribbons such as indicated at 26 may be utilized to provide conductive paths between these vacuum deposited terminals and other terminal pads on the wafer. The foregoing may best be accomplished by electron beam welding or thermocompression bonding of the gold wire ribbons to the terminals on the chip and to the pads on the wafer. The gold ribbon 26 overlays the layer of insulating material 18 and thus is insulated from the thin film circuit. As is also shown in FIGURE 7, a pad of conductive material 28 may be deposited on the surface of insulating film 18. Film 18 thus becomes a dielectric material separating pad 28 and the film 16 and a capacitor is thus formed. The plate of this capacitor consisting of the pad 28 may be connected to a desired terminal pad on the substrate with another gold ribbon 30.

After the joining of active chips or other circuit components to terminal pads on the microcircuit wafer and interconnecting these active chips or components with conductors, the entire subassembly may be hermetically encapsulated to insure against contamination of the junction regions of the active devices. As noted above, the encapsulation will preferably be done after circuitry has been formed on both sides of the microcircuit wafer. The peripheral terminations 14 are used to provide communication of the circuit formed on wafer 10 with the outside world. A plurality of subassemblies produced in accordance with this invention may thus be stacked or decked and interconnected by means of conductors and terminations 14 to provide circuitry capable of performing complex logical functions. As should be obvious to those skilled in the art, the interconnection techniques disclosed herein present a great improvement over the prior art from the standpoint of volumetric efficiency. Also, volumetric efficiency is greatly improved by use of unencapsulated active chips in an electronic subassembly which may later be hermetically encapsulated itself as a unit. The foregoing is particularly true in the case where functional electronic blocks or other monolithic silicon devices are utilized in the subassembly. Another advantage of this invention is that the short interconnecting conductive paths permit the microcircuits to operate at higher frequencies and thus at higher speed. A further and very significant advantage of this invention is that it eliminates the use of masks during the deposition steps in the fabrication and thus permits substantial savings in time and money.

While a preferred embodiment has been shown and described, various modifications and substitutions may be made without deviating from the scope and spirit of this invention. Thus this invention is described by way of illustration rather than limitation and accordingly it is understood that this invention is to be limited only by the appended claims taken in view of the prior art.

I claim:

1. A method of fabricating an electronic subassembly comprising the steps of:

forming discrete pads of metallic material on at least a first surface of a microcircuit wafer, providing an area film of conductive material over at least a portion of at least said first surface of the wafer and pads such that the layer of conductive material makes conductive contact with the pads, forming a layer of insulating material on the exposed surface of the layer of conductive material, etching away the layers of insulating and conductive materials over portions of the pads, etching away the layers of insulating and conductive materials between the pads in accordance with desired patterns thereby forming conductive paths having the desired resistance between the pads, affixing active circuit devices to the exposed portions of at least some of the pads in such a manner that first terminals on the devices make electrical contact with the pads, and providing conductive paths over the insulating material between other terminals on the active devices and other pads.

2. The method of claim 1 wherein the steps of etching away the insulating and conductive layers comprises:

directing an intense beam of charged particles against the coated wafer and pads, deflecting said beam across the surface of the wafer in accordance with a predetermined pattern to thereby cause selective evaporation of said layers.

3. The method of claim 2 wherein the step of forming the discrete pads comprises:

applying a metallic material which will form a tenacious bond with the wafer material to the wafer in molten form in accordance with a predetermined pattern.

4. A method for the fabrication of an electronic circuit module comprising:

forming discrete pads of metallic material on at least a first surface of a microcircuit wafer, depositing an area film of conductive material on said first surface and over and in conductive contact with said pads, removing the film of conductive material over portions of the pads, selectively removing the film of conductive material between the pads in accordance with desired patterns thereby forming conductive paths having the desired resistance between the pads, and affixing active circuit devices to the exposed portions of at least some of the pads in such a manner that first terminals on the devices make electrical contact with the pads.

(References on following page)

References Cited by the Examiner

UNITED STATES PATENTS

| | | | |
|---|---|---|---|
| 2,955,351 | 10/1960 | McCreadie | 29—155.5 |
| 2,958,928 | 11/1960 | Bain | 29—155.5 |
| 3,052,957 | 11/1962 | Swanson | 29—155.5 |
| 3,142,112 | 7/1964 | Burkig | 29—155.5 |
| 3,138,743 | 6/1964 | Kilby | 317—101 |
| 3,142,783 | 7/1964 | Warren | 317—101 |

JOHN F. CAMPBELL, *Primary Examiner.*

LARAMIE E. ASKIN, WHITMORE A. WILTZ, *Examiners.*

S. H. BOYER, W. I. BROOKS, *Assistant Examiners.*